(12) United States Patent
Ong

(10) Patent No.: US 7,955,648 B2
(45) Date of Patent: *Jun. 7, 2011

(54) THIN ALIGNMENT LAYERS FOR LIQUID CRYSTAL DISPLAYS

(75) Inventor: Hiap L. Ong, Diamond Bar, CA (US)

(73) Assignee: Hiap L. Ong and Kyoritsu Optronics, Co., Ltd (TW)

( * ) Notice: Subject to any disclaimer, the term of this patent is extended or adjusted under 35 U.S.C. 154(b) by 984 days.

This patent is subject to a terminal disclaimer.

(21) Appl. No.: 11/227,570

(22) Filed: Sep. 15, 2005

(65) Prior Publication Data

US 2007/0059438 A1    Mar. 15, 2007

(51) Int. Cl.
    C23C 16/00    (2006.01)
    B05D 5/12    (2006.01)
(52) U.S. Cl. .................................. 427/248.1; 427/58
(58) Field of Classification Search ............... 427/248.1, 427/58

See application file for complete search history.

(56) References Cited

U.S. PATENT DOCUMENTS

| 5,759,643 | A * | 6/1998 | Miyashita et al. ........... 428/1.31 |
| 6,339,459 | B1 * | 1/2002 | Ichikawa et al. ................. 349/95 |
| 6,352,594 | B2 * | 3/2002 | Cook et al. ..................... 118/724 |
| 6,491,758 | B1 * | 12/2002 | Hasegawa et al. ............ 118/715 |
| 6,724,449 | B1 * | 4/2004 | Andry et al. .................. 349/124 |
| 2006/0038947 | A1 * | 2/2006 | Rho et al. ....................... 349/122 |
| 2007/0202253 | A1 * | 8/2007 | Ong .......................... 427/248.1 |

FOREIGN PATENT DOCUMENTS

JP    06267852 A  *  9/1994

* cited by examiner

*Primary Examiner* — Timothy H Meeks
*Assistant Examiner* — Kelly M Gambetta
(74) *Attorney, Agent, or Firm* — Silicon Valley Patent Group, LLP; Edward S. Mao

(57) ABSTRACT

A method to form alignment layers on a substrate of an LCD is disclosed. The substrate is placed in a vacuum chamber and undergoes a purging process. The purging process heats the substrates and removes water vapor from the vacuum chamber. Specifically, The vacuum chamber is evacuated to a low pressure and refilled with a preheated inert gas. Evacuation of the vacuum chamber and refilling of the vacuum chamber is repeated several times. The alignment layer is then deposited using chemical vapor deposition.

16 Claims, 4 Drawing Sheets

THIN ALIGNMENT LAYERS FOR LIQUID CRYSTAL DISPLAYS

BACKGROUND OF THE INVENTION

1. Field of the Invention

The present invention relates to liquid crystal displays (LCDs). More specifically, the present invention relates to methods and apparatus for forming alignment layers on a substrate for aligning liquid crystal molecules in multi-domain vertical alignment liquid crystal displays.

2. Discussion of Related Art

Liquid crystal displays (LCDs), which were first used for simple monochrome displays, such as calculators and digital watches, have become the dominant display technology. LCDs are used routinely in place of cathode ray tubes (CRTs) for both computer displays and television displays. Various drawbacks of LCDs have been overcome to improve the quality of LCDs. For example, active matrix displays (using thin-film transistors) replaced passive matrix displays to improve resolution, contrast ratio, viewing angle, response time and reduce ghosting.

However, the primary drawback of conventional LCDs is the viewing angle is very narrow. Even the viewing angle of active matrixes is much smaller than the viewing angle of a conventional cathode ray tube (CRT) display. Specifically, a viewer directly in front of an LCD receives a high quality image; however viewers to the side of the LCD would not receive a high quality image. Multi-domain vertical alignment liquid crystal displays (MVALCDs) were developed to improve the viewing angle of LCDs. However, the primary drawback of MVA LCDs is the high cost of manufacturing LCDs. FIGS. 1(a)-1(b) illustrate the basic structure and functionality of a pixel of a multi Multi-domain vertical alignment liquid crystal displays (MVALCDs) 100. For clarity, MVALCD 100 of FIGS. 1(a)-1(b) is described for grayscale operation.

MVALCD 100 has a first polarizer 105, a first substrate 110, a first electrode 120, a first alignment layer 125, liquid crystals 135, liquid crystals 137, a second alignment layer 140, a second electrode 145, a second substrate 150, a second polarizer 155, and protrusions 160. Alignment layers 125 and 140 are typically formed using a polyimide (PI) film coating. A light source (not shown) sends light from beneath first polarizer 105, which is attached to first substrate 110. The polarization of the first polarizer 105 is generally directed in a first direction and the polarization of the second polarizer 155 is directed perpendicularly to first polarizer 105. Thus, light from the light source would not pass through both first polarizer 105 and second polarizer 155 unless the polarization of the light were to be rotated by 90 degrees between first polarizer 105 and second polarizer 155. For clarity, very few liquid crystals are shown. In actual displays, liquid crystals are rod like molecules, which are approximately 5 angstroms in diameter and 20-25 angstroms in length. Thus, there are over 10 million liquid crystal molecules in a pixel that is 100 μm width by 300 μm length by 3 μm height.

In FIG. 1(a), liquid crystals 135 and 137 are vertically aligned. Specifically, alignment layers 125 and 140 align the liquid crystals in the desired resting position. In the vertical alignment, liquid crystals 135 and 137 would not rotate the polarization of the light from the light source. Thus, light from the light source would not pass through LCD 100. However, as illustrated in FIG. 1(b), when an electric voltage is applied between first electrode 120 and second electrode 140, liquid crystals 135 and 137 reorientate to a tilted position. Specifically, liquid crystals 135 tilt to the left to form a first domain while liquid crystals 137 tilt to the right to form a second domain due to protrusions 160. Liquid crystals in the tilted position rotate the polarization of the polarized light coming through first polarizer 105 by ninety degrees so that the light can then pass through second polarizer 155. The amount of tilting, which controls the rotation of the polarization of the light and thus the amount of light passing through the LCD (i.e., brightness of the pixel), is proportional to the applied voltage of the electric field. Having multiple domains (i.e. liquid crystals 135 and liquid crystals 137) increases the viewing angle of the MVALCD. Generally, a single thin-film-transistor (TFT) is used for each pixel. However for color displays, a color pixel is divided into 3 color components and a separate TFT is used for each color component (typically, Red, Green, and Blue)

The primary drawback of MVA LCDs is the high cost of manufacturing LCDs. While the material cost of polyimide is very low, the process to form of alignment layers 122 and 138 is very costly. Reducing the fabrication cost of the alignment layer can greatly reduce the overall cost of manufacturing liquid crystal displays. Hence there is a need for low cost processes and apparatuses to produce alignment layers in MVA liquid crystal displays.

SUMMARY

Accordingly, the present invention provides a low cost process and apparatus to manufacture alignment layer on a substrate for MVA liquid crystal displays. In accordance with one embodiment of the present invention, a substrate is placed in a vacuum chamber. The vacuum chamber is purged and then filled with an inert gas. The purging and filling of the vacuum chamber is repeated several times to remove water vapor from the vacuum chamber. Furthermore, in some embodiments of the present invention, the inert gas is preheated so that the substrate is warmed during the purging and refilling process. The alignment layer is then formed using chemical vapor deposition of a silane material onto the substrate.

The present invention will be more fully understood in view of the following description and drawings.

DETAILED DESCRIPTION

Figure 1A:
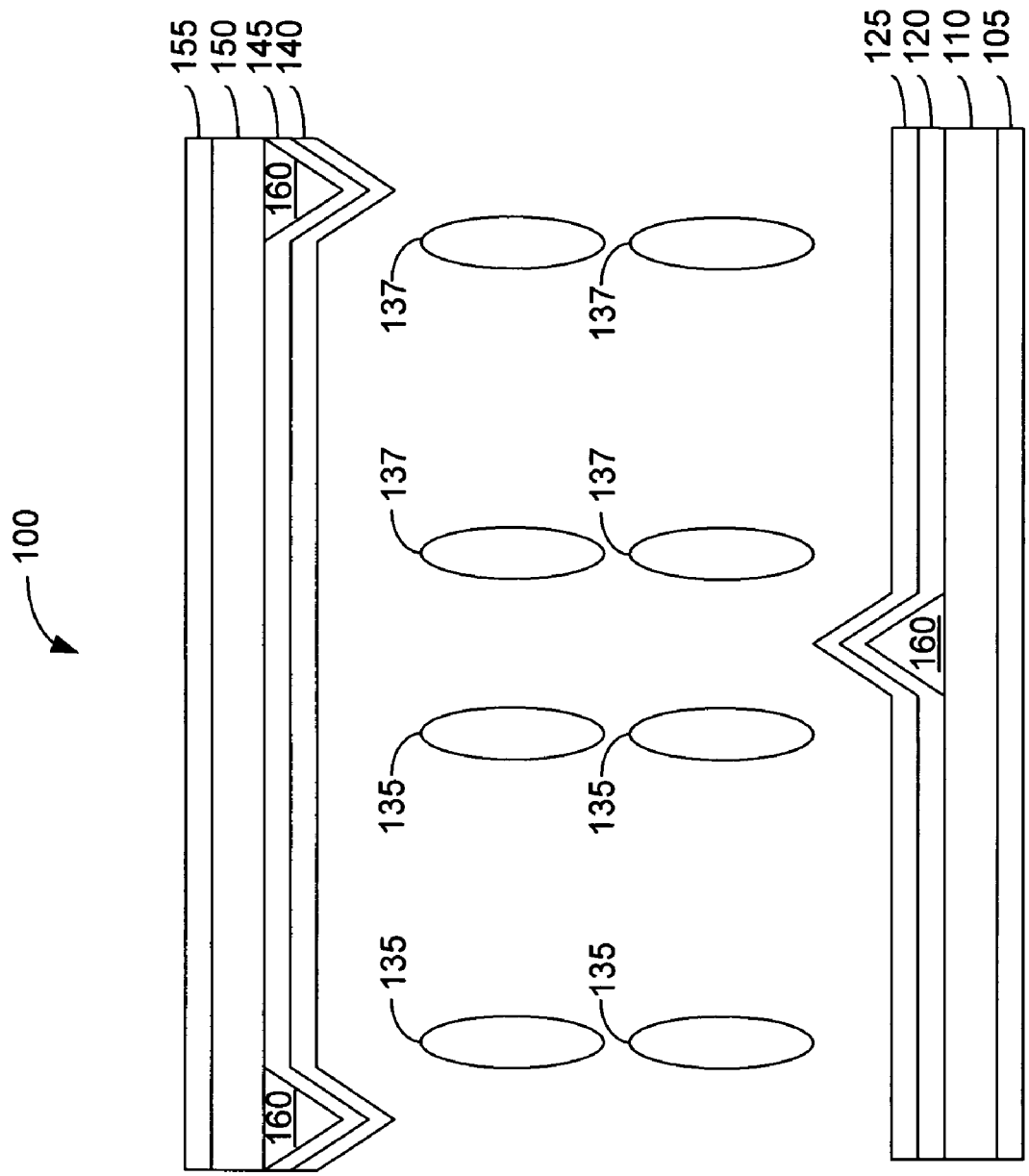
FIGS. 1(a)-1(b) are an illustration of a pixel of a conventional Multi-Domain vertical alignment LCD (MVALCD).
Figure 1B:
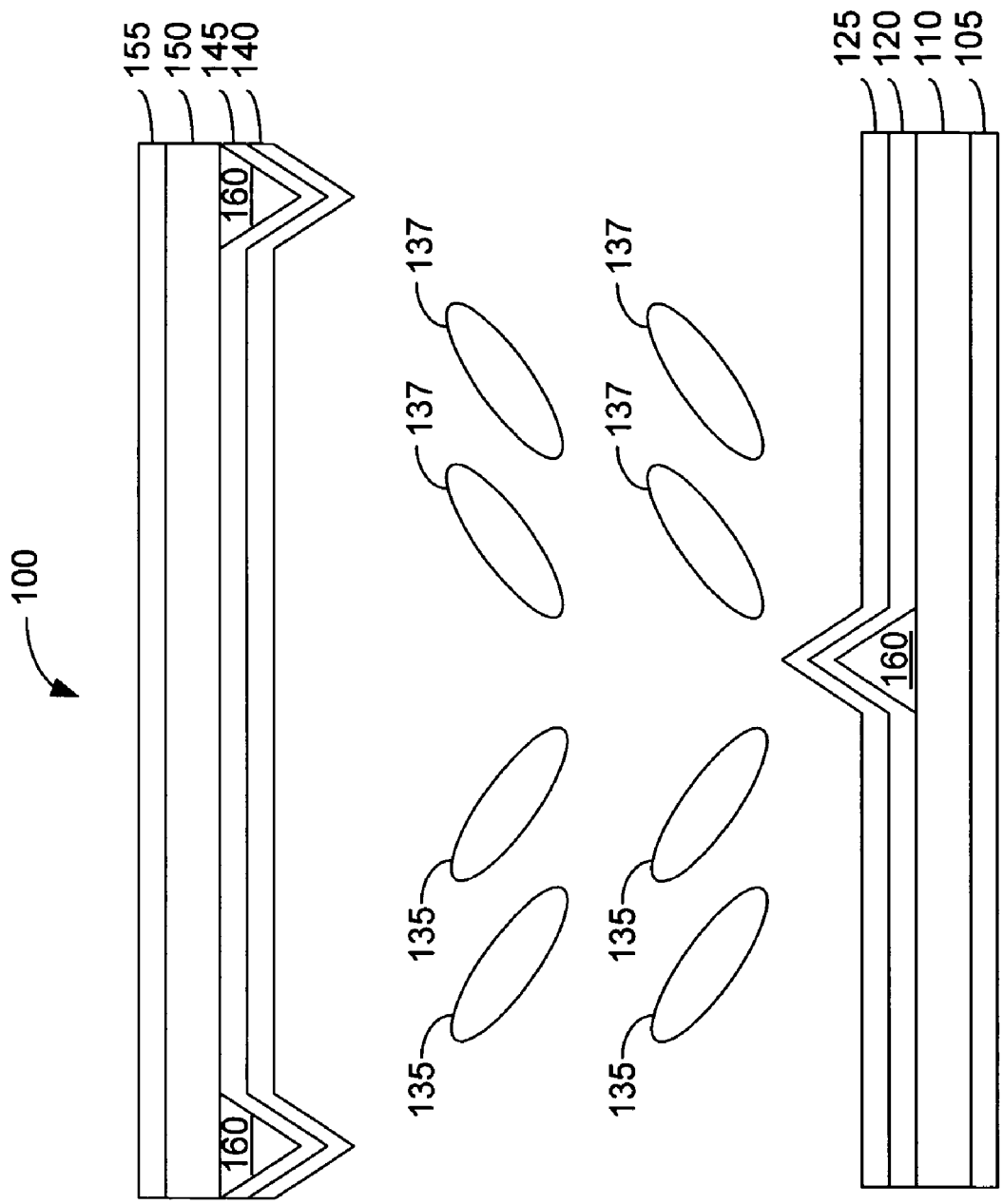
Figure 2:
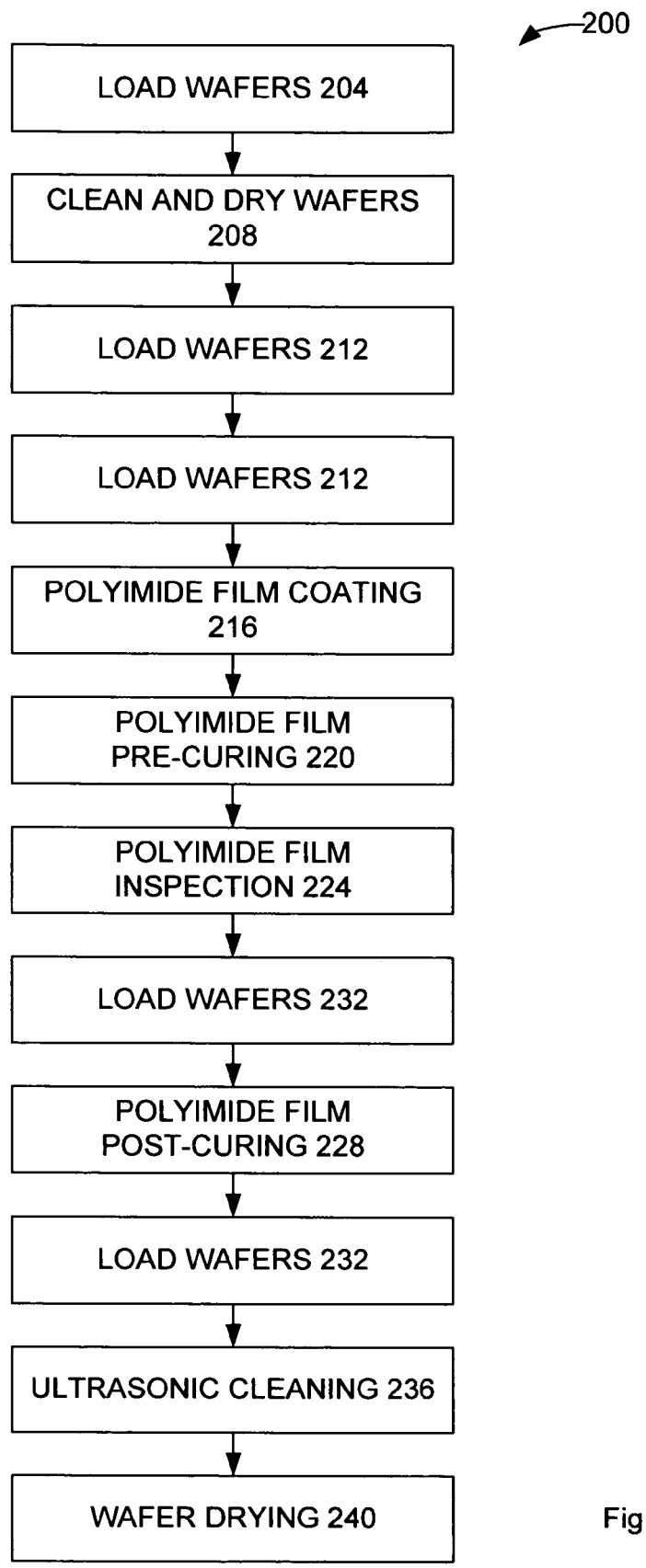
FIG. 2 is a process flow diagram of a conventional process to create an alignment layer for a MVALCD.

FIG. 2 is a process flow diagram of a conventional process 200 to form an alignment layer in a multi-domain vertically aligned liquid crystal display. Conventional process 200 requires the use of several different machines such as, wafer cleaning machine, a polyimide coating machine, a polyimide pre-curing oven, a polyimide post curing oven, and an ultrasonic cleaning machine. In the fabrication process, multiple wafers, which contain one or more substrates for LCDs, are loaded into cassettes, which are then placed the machines for processing. In LOAD WAFERS 204, wafers are loaded into a "cassette" and placed in the wafer-cleaning machine. In general, multiple cassettes are placed in each of the process machine, such as the wafer-cleaning machine. The cleaning machine then cleans and dry the wafers in CLEAN AND DRY WAFERS 208. The wafers are then loaded in a second cassette and placed into a polyimide coating machine in LOAD WAFERS 212. In POLYIMIDE FILM COATING 216, the polyimide coating machine coats the wafer with a polyimide film. The second cassette is then transferred to a polyimide pre-curing oven, which pre-cures the polyimide film in POLYIMIDE PRE-CURING 220.

The wafers are then inspected in POLYIMIDE FILM INSPECTION 224. Wafers that do not pass inspection are removed. The wafers that pass inspection are reloaded in a third cassette and placed in a polyimide post-curing oven in LOAD WAFERS 226. Then, the polyimide post-curing oven cures the polyimide film in POLYIMIDE FILM POST-CURING 228. The wafers are then loaded into another cassette at LOAD WAFER 232 and placed into an ultrasonic cleaning and brushing machine, which processes the wafers with ultrasonic cleaning and brushing in ULTASONIC CLEANING 236. The wafers are then dried in WAFER DRYING 240.

Thus, using conventional process 200 to create the alignment layer of an LCD involves multiple costly pieces of machinery and several labor-intensive or expensive automated loading and unloading steps. The machines used in conventional process 200, each can cost several million dollars. Furthermore, conventional process 200 creates a large amount of waste products and consumes a large amount of water.

Figure 3:
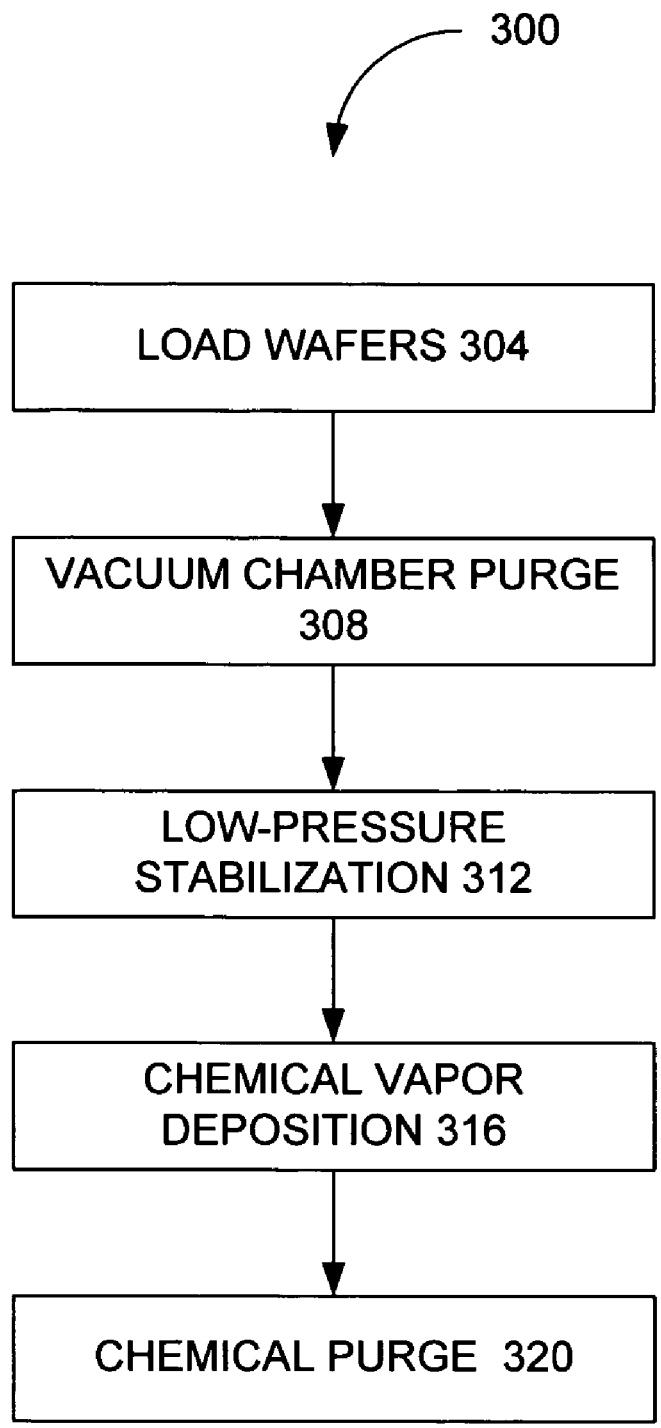
FIG. 3 is a process flow diagram of a process to create an alignment layer for a MVA liquid crystal display in accordance with one embodiment of the present invention.

FIG. 3 is a process flow diagram of a novel process 300 to fabricate a liquid crystal alignment layer for MVALCD in accordance with one embodiment of the present invention. Novel process 300 is performed using a single piece of machinery. Specifically, a vacuum-bake/vapor prime coating machine. Vacuum-bake/vapor prime coating machines are available from a variety of sources, such as Model 1224 from Yield Engineering Systems. In LOAD WAFERS 304, the wafers are loaded in a cassette and placed in the vacuum-bake/vapor prime coating machine.

In VACUUM CHAMBER PURGE 308, a vacuum chamber purge process is performed to completely remove water vapor that may be present in the vacuum chamber. Specifically, the vacuum chamber is evacuated to a low pressure, such as 10-30 millitorrs, and refilled with a pre-heated inert gas, such as nitrogen, at a temperature of 80-200° C. The evacuation/refilling with nitrogen can be repeated several times to insure complete removal of water vapor from the vacuum chamber. Furthermore, due to the preheated nitrogen and by the thermal heating element in the oven, the wafers are brought to a temperature that facilitates chemical vapor deposition (as described below).

Then, in LOW-PRESSURE STABILIZATION 312, the vacuum chamber is held at a low pressure (for example 1 torr) for approximately 10 minutes. LOW-PRESSURE STABILIZATION 312 allows the wafer to be heated to the same temperature. Thus, thicker wafers should be held in the low-pressure process longer than thinner wafers.

The actual alignment layer is formed in CHEMICAL VAPOR DEPOSITION 316. Specifically, silane chemicals are pumped directly from a source bottle to the vaporization chamber. To minimize chemical degradation, the source bottle could be evacuated of gasses and filled with an inert gas, such as nitrogen, prior to transference of the silane chemicals to the vaporization chamber. Various silane materials can be used, such as amino silanes, epoxy silanes, and mercapto silanes. These silane materials can be used to fabricate vertical and parallel LC alignments. In one embodiment of the present invention the silane chemical is a 100% pure material of 1H 1H 2H 2H Perfluorooctyltriethoxysilane.

In another embodiment of the present invention the silane chemical is a 100% pure material of Perflourooctyltriethoxysilane. Other suitable silane materials include Trichlorosilane, 3-Aminopropyltriethoxysilane, Octyltriethoxysilane, Dimthyle octadecyl[3-(trimethoxysilyl) propyl]ammonium chloride, Dimethyldichlorosilane, and L-alpha-phosphatidylcholine. The These chemicals are available from Alfa Aesar (a Johnson Mathey Company) of Windham, N.H. and/or Sigma-Aldrich Corp of St. Louis, Mo.

In most MVALCDs, the electrodes are typically constructed using Indium Tin Oxide (ITO), which is a transparent conductive material. Some materials used to form liquid crystal alignment layers do not adhere to ITO. However, 1H 1H 2H 2H-perfluorooctyltriethoxysilane and trichlorosilane do adhere very well to ITO. In addition many of the materials that do not adhere to ITO do adhere to 1H 1H 2H 2H-perfluorooctyltriethoxysilane and trichlorosilane. Thus, in some embodiments of the present invention, a two step chemical vapor deposition process is used. Specifically, a more adhesive alignment layer material, such as 1H 1H 2H 2H-perfluorooctyltriethoxysilane or trichlorosilane, is first deposited over the ITO electrodes. Then a second alignment layer material, which is deposited over the more adhesive material, is used to form the liquid crystal alignment layer.

The chemicals are vaporized and pumped into the vacuum chamber with the wafers. With chemical vapor deposition, alignment layers in accordance with the present invention can be much thinner than conventional alignment layers. For example, using the process of the present invention, alignment layers can be made as thin as 5 to 50 Angstroms as opposed to 800 to 3000 angstroms for conventional alignment layers.

After formation of the alignment layer, the vacuum chamber is purged of chemicals in CHEMICAL PURGE 320. Specifically, the vacuum chamber is purged and refilled with an inert gas, such as nitrogen, several times to remove the chemical vapors. A vapor trap on the vacuum exhaust line can be used to prevent silane chemicals from entering the vacuum pump.

The present invention can also be used for LCDs that require pre-tilted liquid crystals, i.e. alignment layers that hold liquid crystals in a slightly tilted state even when no voltage is applied across the liquid crystals. In one embodiment of the present invention, a photosensitive material and a photo-alignment process is used to fabricate LC alignment with a tilted alignment and a homogenous planer LC alignment. These LC alignments can be used to fabricate single domain and multi-domain TN (twisted nematic), ECB (electrically-induced birefringence mode), IPS (in-plane switching) and MVA LCDs.

Thus, novel processes in accordance with the present invention produces an alignment layer using less equipment than conventional techniques and requires less labor or less automated equipments (i.e. to load and unload wafers). The equipment cost to implement the process of the presenting invention is estimated to be only 20% of the cost of equipment required by conventional processes to form alignment layers in liquid crystal displays. Furthermore costs are reduced because chemical wastage and water wastage are greatly reduced. In addition, because fewer machines are required, factory space requirements are also greatly reduced.

In addition to the cost advantage of the present invention, the resulting alignment layers and wafers produced using the teachings of the present invention offer several functional advantages over conventional alignment layers. Specifically, the alignment layers formed using the present invention can be made thinner and are more uniform than conventional alignment layers. For example, using the process of the present invention, alignment layers can be made as thin as 5 to 50 Angstroms as opposed to 800 to 3000 angstroms for conventional alignment layers. Furthermore, the chance of contamination is greatly reduced by using vapor deposition rather than liquid coatings.

In the various embodiments of the present invention, novel structures and methods have been described for creating an alignment layer for liquid crystal displays. The various embodiments of the structures and methods of this invention that are described above are illustrative only of the principles of this invention and are not intended to limit the scope of the invention to the particular embodiments described. For example, in view of this disclosure those skilled in the art can define other vacuum chamber purge processes, low pressure stabilization processes, chemical vapor deposition processes, chemical purge processes, chemicals, ovens, vacuum chambers, vacuum-bake/vapor prime coating machine, and so forth, and use these alternative features to create a method, or system according to the principles of this invention. Thus, the invention is limited only by the following claims.

What is claimed is:

1. A method to form a liquid crystal alignment layer on a substrate of a LCD, the method comprising:
   placing the substrate in a vacuum chamber;
   purging the vacuum chamber; and
   depositing the liquid crystal alignment layer using chemical vapor deposition of a silane material, further comprising vaporizing a chemical, wherein the chemical is perfluorooctyltriethoxysilane.

2. The method of claim 1, wherein the purging the vacuum chamber removes water vapor from the vacuum chamber.

3. The method of claim 1, wherein the purging the vacuum chamber further comprises:
   evacuating the vacuum chamber to a low pressure; and
   refilling the vacuum chamber with an inert gas.

4. The method of claim 3, wherein the purging the vacuum chamber further comprises:
   evacuating the vacuum chamber to a low pressure for a second time; and
   refilling the vacuum chamber with the inert gas for a second time.

5. The method of claim 3, wherein the inert gas is preheated to a temperature between 80 and 200 ° C., inclusive.

6. The method of claim 3, wherein the inert gas is nitrogen.

7. The method of claim 3, wherein the low pressure between 10 and 30 millitorrs, inclusive.

8. The method of claim 1, further comprising performing low pressure stabilization on the substrate.

9. The method of claim 8, wherein the performing low pressure stabilization comprises:
   evacuating the vacuum chamber to a low pressure; and
   maintaining the low pressure for a time period.

10. The method of claim 9, wherein the low pressure is approximately 1 torr and the time period is approximately 10 minutes.

11. The method of claim 1, wherein the depositing the liquid crystal alignment layer using chemical vapor deposition of a silane material, further comprises:
    evacuating gasses from a source bottle containing the chemical and
    filling the source bottle with an inert gas.

12. The method of claim 1, wherein the perfluorooctyltriethoxysilane is 1H 1H 2H 2H-perfluorooctyltriethoxysilane.

13. The method of claim 1, further comprising purging the vacuum chamber after depositing the liquid crystal alignment layer using chemical vapor deposition.

14. The method of claim 12, wherein the purging the vacuum chamber further comprises:
    evacuating the vacuum chamber; and
    filling the vacuum chamber with an inert gas.

15. The method of claim 1, wherein the liquid crystal alignment layer has a thickness of less than 800 Angstrom.

16. The method of claim 1, wherein the liquid crystal alignment layer has a thickness of less than 50 Angstroms.

* * * * *